(12) United States Patent
Fukuzumi

(10) Patent No.: US 7,002,199 B2
(45) Date of Patent: Feb. 21, 2006

(54) SEMICONDUCTOR DEVICE USING HIGH-DIELECTRIC-CONSTANT MATERIAL AND METHOD OF MANUFACTURING THE SAME

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/316,653

(22) Filed: Dec. 11, 2002

(65) Prior Publication Data

US 2003/0122174 A1 Jul. 3, 2003

(30) Foreign Application Priority Data

Dec. 17, 2001 (JP) .............................. 2001-383469

(51) Int. Cl.
*H01L 27/108* (2006.01)
*H01L 29/76* (2006.01)
*H01L 29/94* (2006.01)
*H01L 31/119* (2006.01)

(52) U.S. Cl. ........................ 257/296; 257/310; 257/306
(58) Field of Classification Search ................ 257/296, 257/303, 306, 307, 308, 309
See application file for complete search history.

(56) References Cited

U.S. PATENT DOCUMENTS 5,387,546 A * 2/1995 Maeda et al. ............... 438/784
6,051,859 A * 4/2000 Hosotani et al. ............ 257/306
6,175,130 B1 * 1/2001 Hosotani et al. ............ 257/301
6,403,444 B1 * 6/2002 Fukuzumi et al. .......... 438/396
6,528,834 B1 * 3/2003 Durcan et al. .............. 257/296
6,555,431 B1 * 4/2003 Xing et al. .................. 438/253
6,600,183 B1 * 7/2003 Visokay et al. ............. 257/295
6,620,680 B1 * 9/2003 Durcan et al. .............. 438/253
2004/0026119 A1 * 2/2004 Chen .......................... 174/200

OTHER PUBLICATIONS

Y. Fukuzumi, et al., "Liner-Supported Cylinder (LSC) Technology to realize Ru/$Ta_2O_3$/Ru Capacitor for Future DRAMs", IEDM 2000, p. 793.

* cited by examiner

*Primary Examiner*—George Fourson
*Assistant Examiner*—Fernando L. Toledo
(74) *Attorney, Agent, or Firm*—Hogan & Hartson, L.L.P.

(57) ABSTRACT

A semiconductor device includes a MOS transistor, interlayer dielectric film, first and second high-dielectric-constant films, and first and second conductive films. The MOS transistor is formed on a semiconductor substrate. The interlayer dielectric film is formed on the semiconductor substrate so as to cover the MOS transistor. The first high-dielectric-constant film is formed on the interlayer dielectric film and has an opening portion that reaches the interlayer dielectric film. The first conductive film contains a metal element and is formed to be partially embedded in the opening portion. The second high-dielectric-constant film is formed on the first conductive film. The second conductive film is formed on the second high-dielectric-constant film.

24 Claims, 15 Drawing Sheets

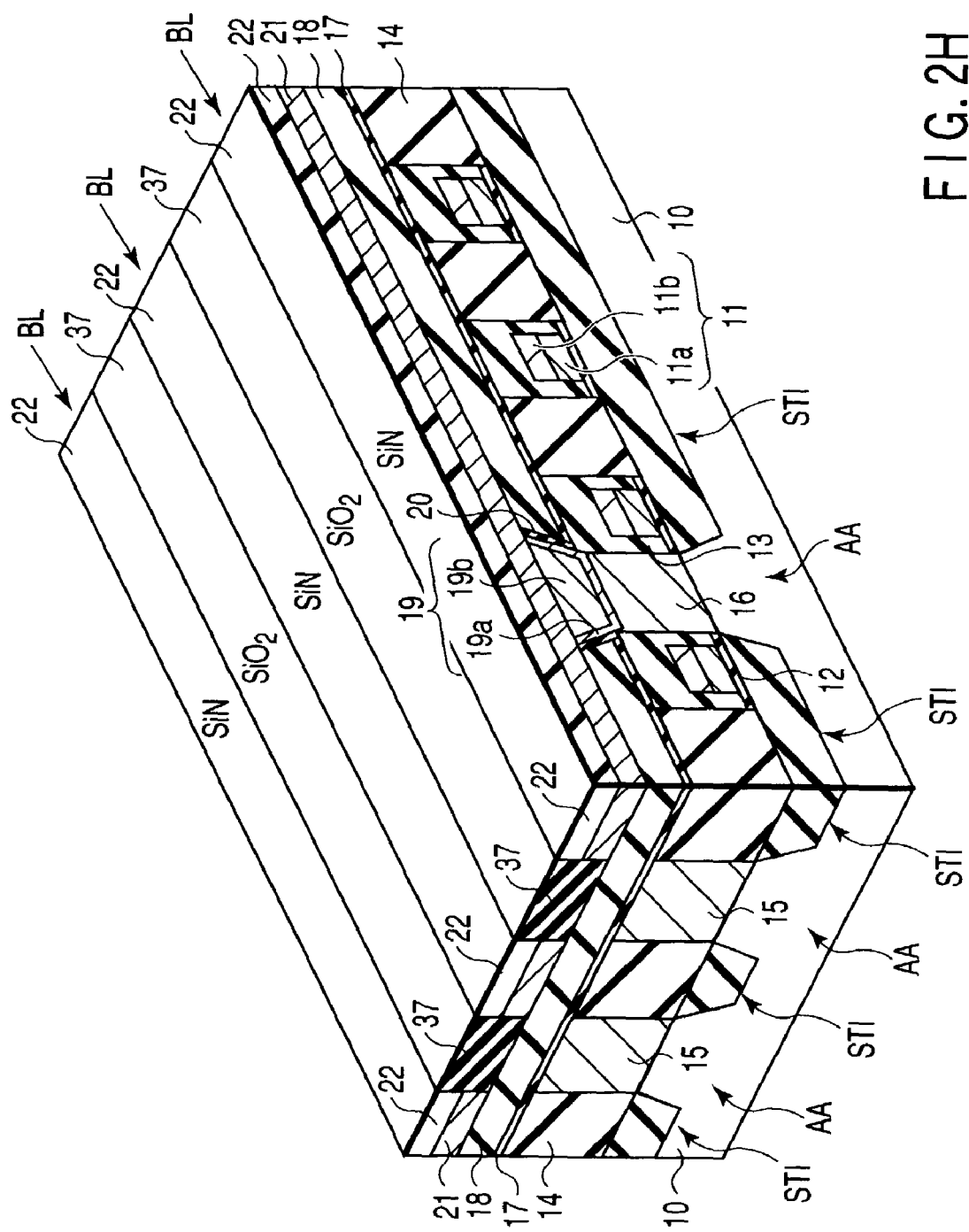
F I G. 2H

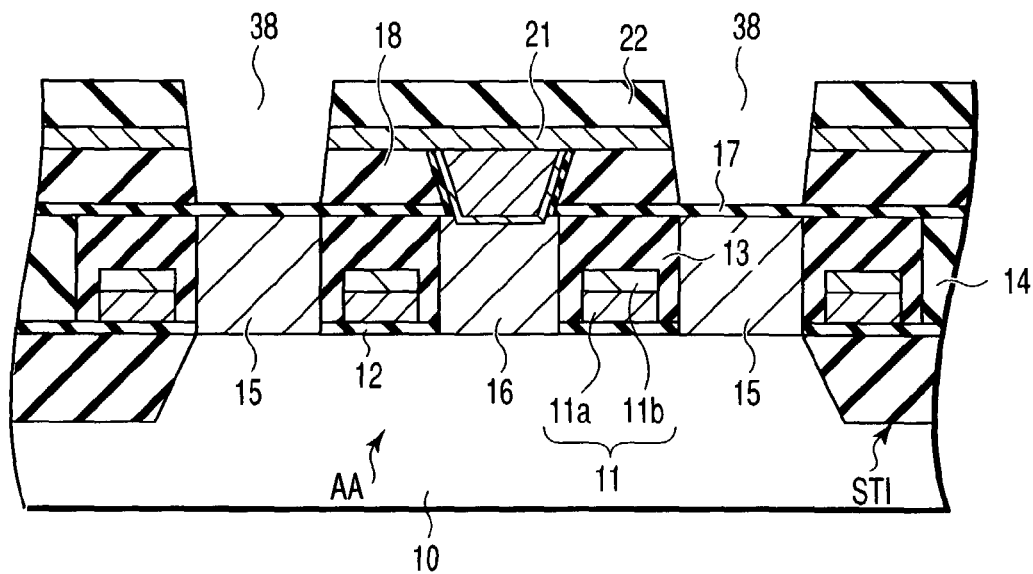
F I G. 2I
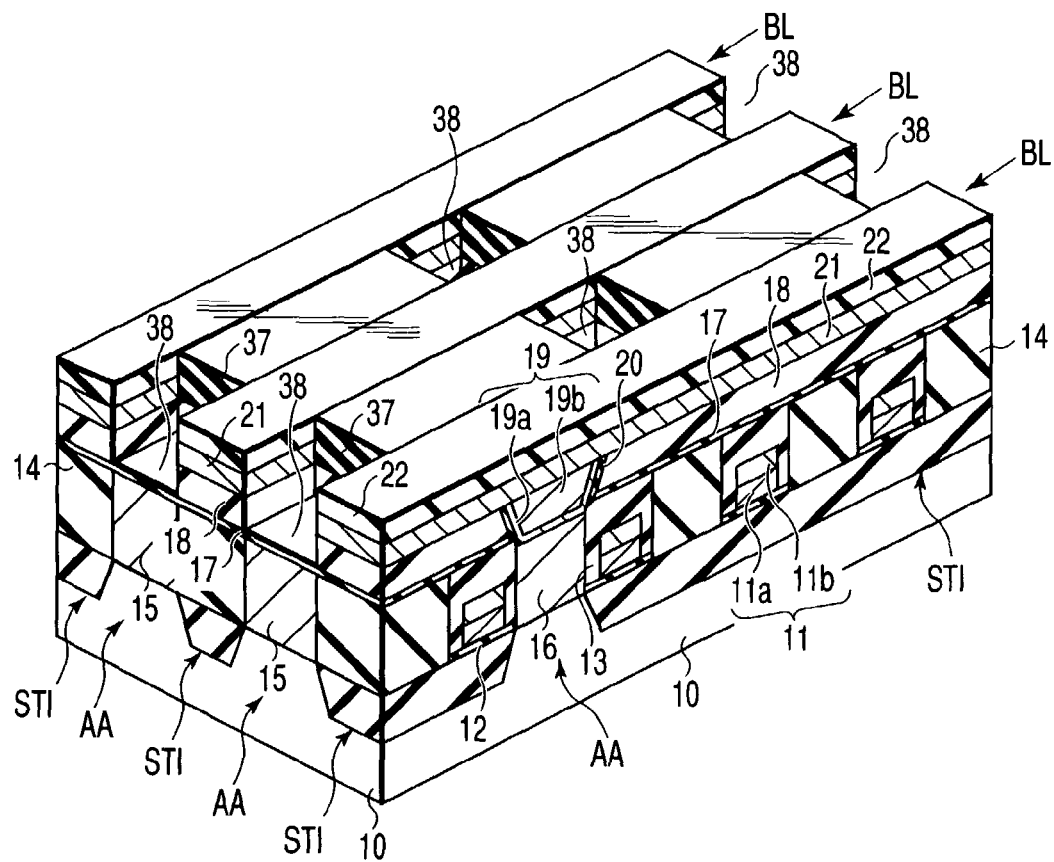
F I G. 2J

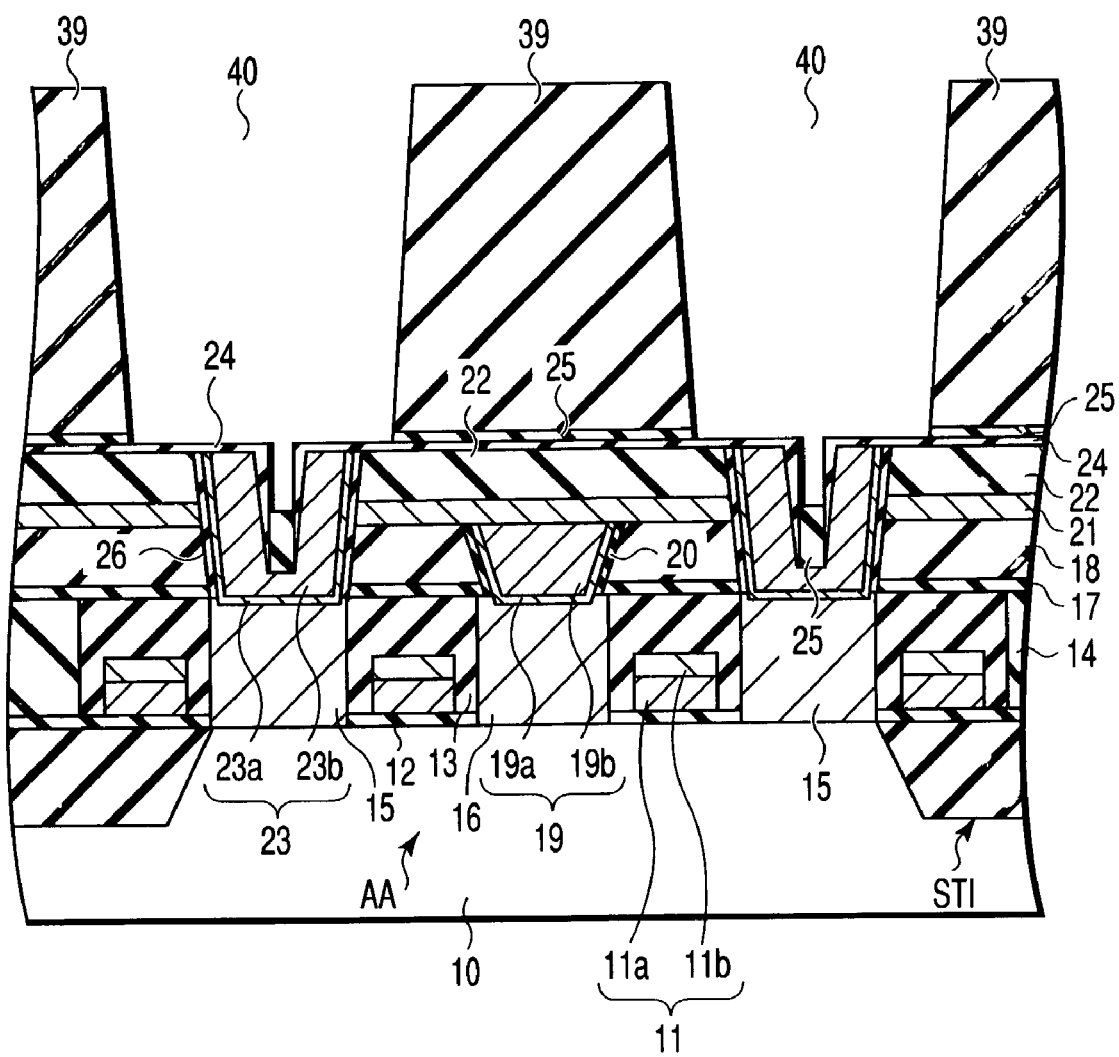
F I G. 20

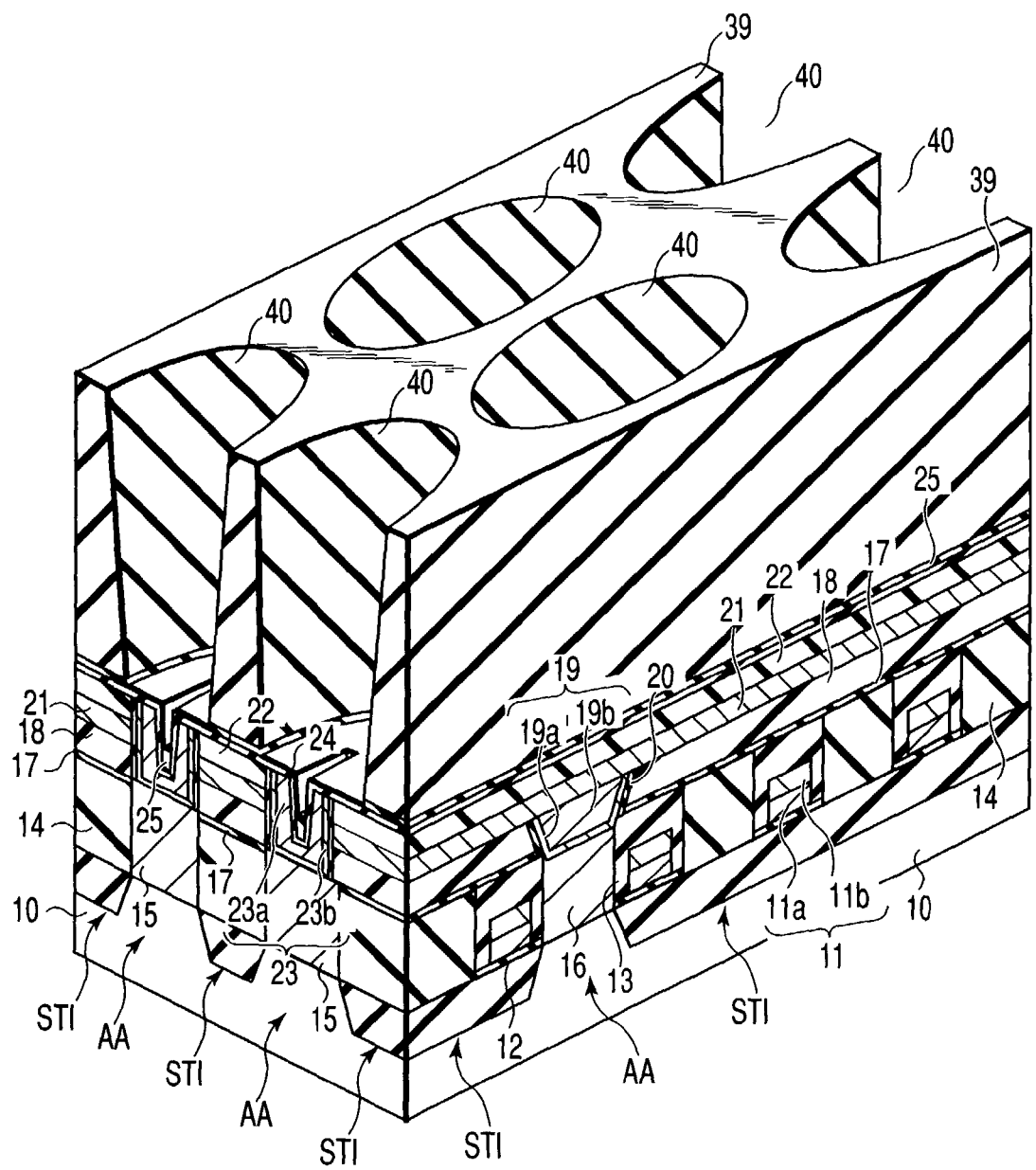
F I G. 2P

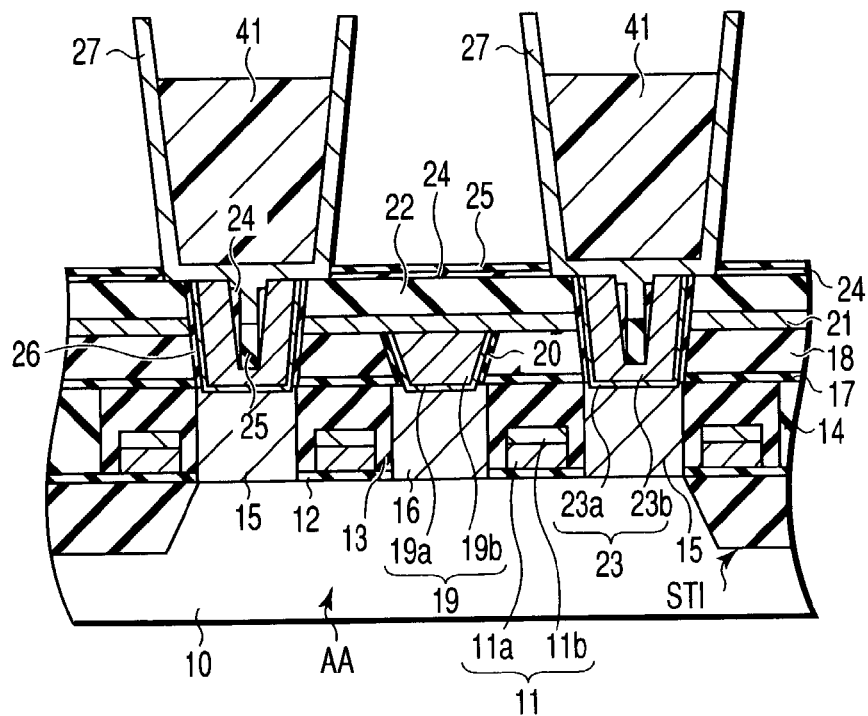
F I G. 2S
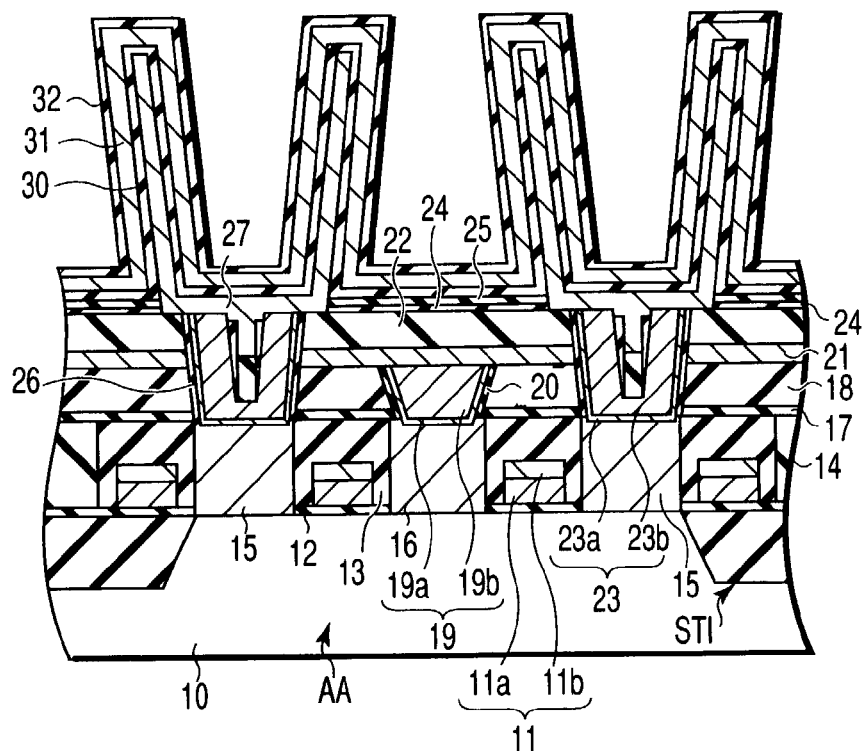
F I G. 2T

SEMICONDUCTOR DEVICE USING HIGH-DIELECTRIC-CONSTANT MATERIAL AND METHOD OF MANUFACTURING THE SAME

CROSS-REFERENCE TO RELATED APPLICATIONS

This application is based upon and claims the benefit of priority from the prior Japanese Patent Application No. 2001-383469, filed Dec. 17, 2001, the entire contents of which are incorporated herein by reference.

BACKGROUND OF THE INVENTION

1. Field of the Invention

The present invention relates to a semiconductor device and method of manufacturing the same and, more particularly, to a technique for improving the reliability of a DRAM (Dynamic Random Access Memory).

2. Description of the Related Art

The micropatterning technology for semiconductor devices is remarkably developing in recent years. Especially, development of the micropatterning technology for DRAMs has been accelerated than ever. Accordingly, to ensure a sufficient capacitance of a capacitor in a limited occupation area, use of high-dielectric-constant materials for the capacitor insulating films of cell capacitors has been examined. In addition, metal electrodes which can enhance the characteristics of high-dielectric-constant materials at maximum have been developed in place of conventional silicon electrodes.

A capacitor structure having a capacitor insulating film, using a high-dielectric-constant material, and a metal electrode is proposed in, e.g., Y. Fukuzumi et al., "Linear-Supported Cylinder (LSC) Technology to Realize Ru/$Ta_2O_5$/Ru Capacitor for Future DRAMs", IEDM 2000, p. 793. An MIM capacitor having an Ru/$Ta_2O_5$/Ru structure is proposed here.

According to the proposed structure, the adhesion between an interlayer dielectric film and a storage node electrode using ruthenium is increased by using a liner material. This structure can prevent, e.g., a wet etchant from soaking between the storage node electrode and the interlayer dielectric film. However, since liner material deposition and removal steps are necessary, the number of processes increases. Additionally, the liner material is not sufficiently resistant to oxidation. Hence, in the $Ta_2O_5$ film deposition step or high-temperature annealing step in an oxygen atmosphere, the plug material immediately under the cell capacitor may sometimes oxidizes and degrades. As a consequence, the reliability of a memory cell tends to be low.

BRIEF SUMMARY OF THE INVENTION

A semiconductor memory device according to an aspect of the present invention comprises:

a MOS transistor formed on a semiconductor substrate;

a first interlayer dielectric film formed on the semiconductor substrate so as to cover the MOS transistor;

a first high-dielectric-constant film formed on the first interlayer dielectric film and having an opening portion that reaches the first interlayer dielectric film;

a first conductive film containing a metal element and formed to be partially embedded in the opening portion, the first conductive film being in contact with the first high-dielectric constant film, an upper surface of the first high-dielectric-constant film being lower than a top of the first conductive film;

an insulating film which is formed between the first interlayer dielectric film and the first high-dielectric-constant film, and is formed from a material different to the first interlayer dielectric film, the first conductive film being in contact with the insulating film;

a second high-dielectric-constant film formed on the first conductive film; and a second conductive film formed on the second high-dielectric-constant film.

A method for fabricating a semiconductor device according to an aspect of the present invention comprises:

forming a first interlayer dielectric film on a semiconductor substrate;

forming a contact plug in the first interlayer dielectric film;

forming a first high-dielectric-constant film on the first interlayer dielectric film;

forming a second interlayer dielectric film on the first high-dielectric-constant film;

forming, in the second interlayer dielectric film, a trench portion so deep as to reach the first interlayer dielectric film to expose an upper surface of the contact plug to a bottom surface of the trench portion;

forming a storage node electrode on the bottom surface and a side surface of the trench portion using a material containing a metal element belonging to a platinum group, the first high-dielectric-constant film being substantially formed from a material having a higher adhesion to the storage node electrode than to the first and second interlayer dielectric films;

removing the second interlayer dielectric film by etching using the first high-dielectric-constant film as an etching stopper;

forming a capacitor insulating film on the storage node electrode using a high-dielectric-constant material; and forming a plate electrode on the capacitor insulating film using a material containing a metal element.

BRIEF DESCRIPTION OF THE SEVERAL VIEWS OF THE DRAWING

FIG. 2H is a sectional perspective view of FIG. 2G;

FIG. 2I is a sectional view showing the step in manufacturing the DRAM according to the first embodiment of the present invention;

FIG. 2J is a sectional perspective view of FIG. 2I;

FIGS. 2K to 2O are sectional views sequentially showing the step in manufacturing the DRAM according to the first embodiment of the present invention;

FIG. 2P is a sectional perspective view of FIG. 2O;

FIGS. 2Q to 2U are sectional views sequentially showing the step in manufacturing the DRAM according to the first embodiment of the present invention;

DETAILED DESCRIPTION OF THE INVENTION

Figure 1A:
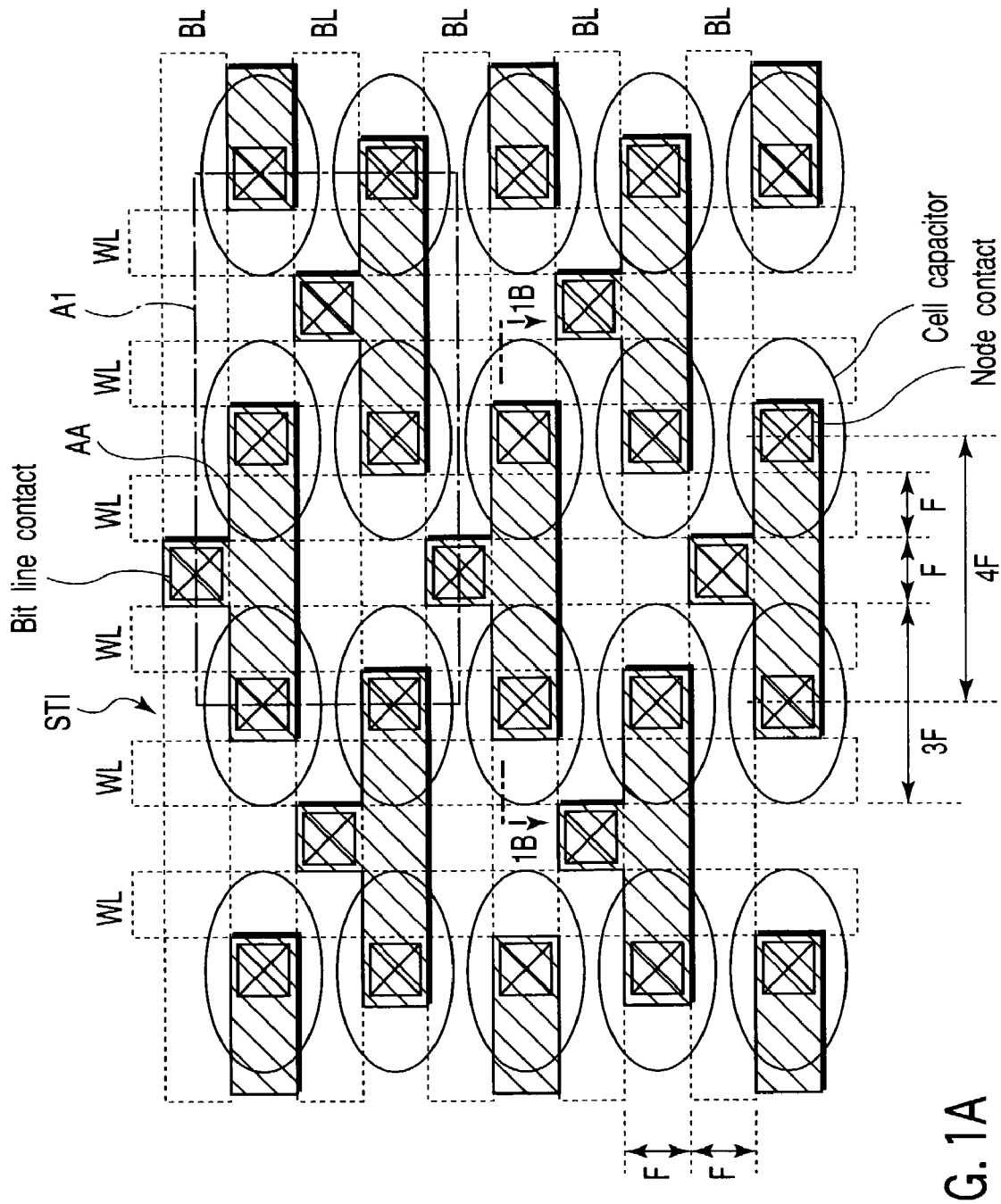
FIG. 1A is a plan view of a DRAM according to the first embodiment of the present invention.
Figure 1B:
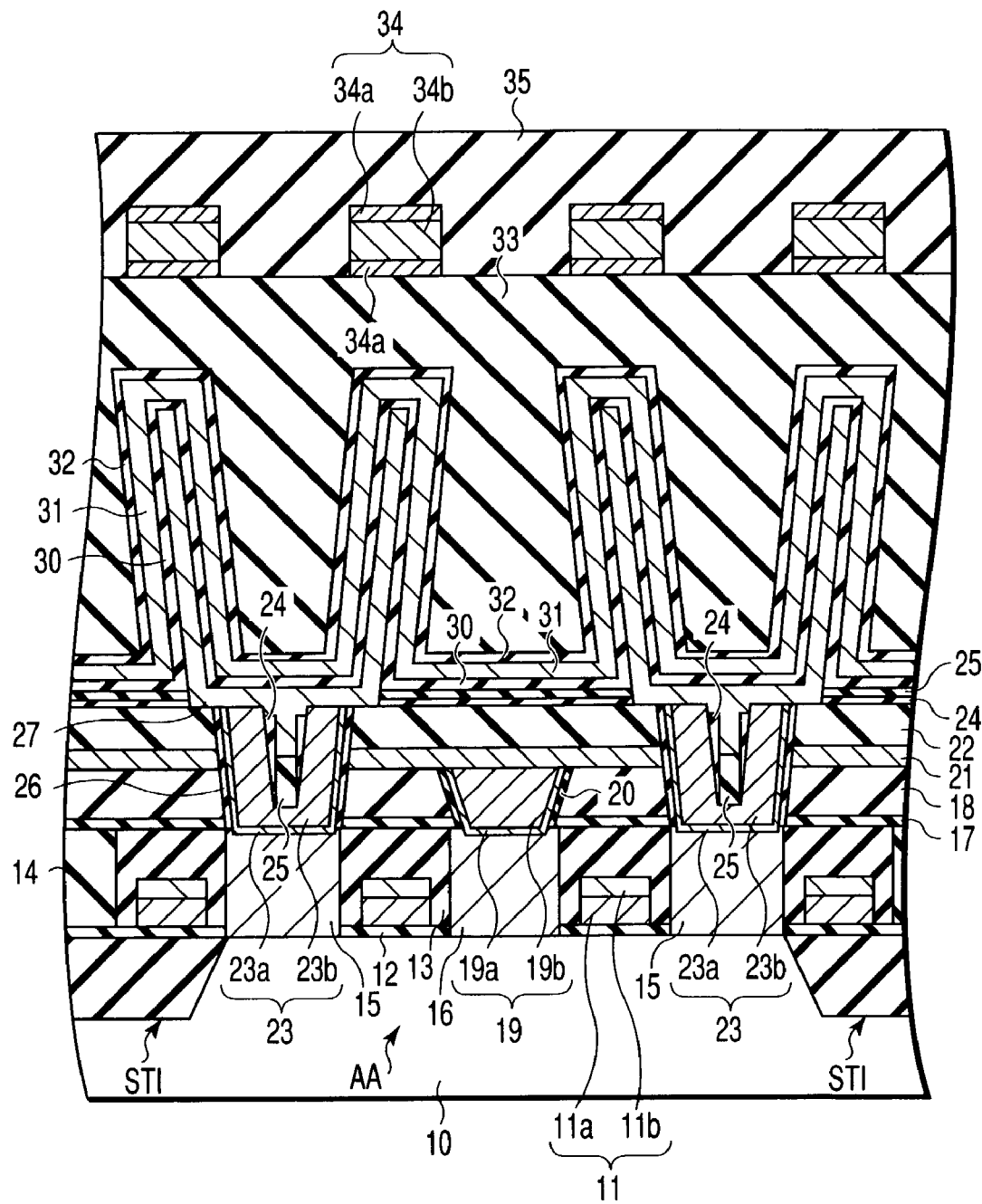
FIG. 1B is a sectional view taken along a line 1B—1B in FIG. 1A.

A semiconductor device according to the first embodiment of the present invention will be described with reference to FIGS. 1A and 1B. FIG. 1A is a plan view of a DRAM which employs a double-surface-cylinder stacked capacitor structure for a cell capacitor. FIG. 1B is a sectional view taken along a line 1B—1B in FIG. 1A.

As shown in FIGS. 1A and 1B, a plurality of element regions AA where memory cells should be formed stagger in a silicon substrate 10. Referring to FIG. 1A, hatched regions indicate the element regions AA. Regions except the element regions AA are element isolation regions STI.

Gate electrodes 11 are formed on the silicon substrate 10 with gate insulating films 12 interposed therebetween. Each gate electrode 11 has a two-layered structure including, e.g., a polysilicon film 11a and tungsten film (W) 11b. The gate electrodes 11 are formed into a stripe that extends across the plurality of element regions AA in a direction perpendicular to the longitudinal direction of the element regions AA. Each gate electrode 11 functions as a word line WL and is connected to a row decoder (not shown). Impurity diffusion layers (not shown) serving as source and drain regions are selectively formed in the silicon substrate 10, thereby forming cell transistors.

A silicon nitride film 13 covers the upper and side surfaces of the gate electrode 11 of each cell transistor. In addition, an interlayer dielectric film 14 flush with the upper surface of the silicon nitride film 13 is formed on the silicon substrate 10. Cell contact plugs 15 and 16 connected to the source and drain regions of each cell transistor are formed in the interlayer dielectric film 14.

A metal diffusion barrier film 17 is formed on the interlayer dielectric film 14 and silicon nitride film 13. An interlayer dielectric film 18 is formed on the metal diffusion barrier film 17. The metal diffusion barrier film 17 is formed from, e.g., a silicon nitride film. A bit line contact plug 19 that reaches the contact plug 16 is formed in the interlayer dielectric film 18. The bit line contact plug 19 connects the contact plug 16 to a bit line BL. The bit line contact plug 19 is made of, e.g., a barrier metal film 19a having a TiN/Ti multilayered structure and a tungsten film 19b. A sidewall insulating film 20 is formed between the bit line contact plug 19 and the interlayer dielectric film 18 and between the bit line contact plug 19 and metal diffusion barrier film 17. The sidewall insulating film 20 is made of, e.g., a silicon nitride film.

Metal interconnection layers 21 serving as the bit lines BL are formed on the interlayer dielectric films 18. A silicon nitride film 22 is formed on each metal interconnection layer 21. The bit lines BL are formed into a strip in a direction perpendicular to the word lines WL. Each bit line BL is electrically connected to the plurality of bit line contact plugs 19 and also to a column selector (not shown). Note that silicon oxide films (not shown) flush with the upper surfaces of the silicon nitride films 22 are formed on the interlayer dielectric films 18 between the bit lines BL adjacent to each other.

Node contact plugs 23 which extend to contact plugs 15 through the silicon oxide films, interlayer dielectric films 18, and metal diffusion barrier films 17 are formed. Each node contact plug 23 connects the contact plug 15 to the storage node electrode of a cell capacitor and has a multilayered structure of, e.g., TiN films 23a and 23b. Note that the node contact plug 23 has a cavity region filled with a silicon nitride film 24 and tantalum oxide film ($Ta_2O_5$ film) 25. A sidewall insulating film 26 made of, e.g., a silicon nitride film is formed on the sidewall of the node contact plug 23.

A storage node electrode 27 of a double-surface-cylinder cell capacitor is formed on each node contact plug 23. The storage node electrode 27 is formed using, e.g., a platinum group element such as ruthenium (Ru) to fill the cavity region of the node contact plug 23. A platinum group element is used as the capacitor electrode material to exploit the maximum characteristics of a high-dielectric-constant film or ferroelectric film such as a $Ta_2O_5$ film serving as a capacitor insulating film.

The silicon nitride films 24 and $Ta_2O_5$ films 25 serving as etching stopper films are formed on the silicon nitride films 22 on which no storage node electrodes 27 are present and on the silicon oxide films between the bit lines BL. A capacitor insulating film 30 is formed on the storage node electrodes 27. A plate electrode 31 is formed on the capacitor insulating film 30. Thus, double-surface-cylinder stacked capacitors are formed. Note that the capacitor insulating film 30 is formed from, e.g., a $Ta_2O_5$ film, and the plate electrode 31 is formed from a ruthenium film.

The distance between the adjacent word lines WL, the width of each bit line BL, the width of each element isolation region STI, and the like are generally designed on the basis of the fabrication process size in terms of process. Let F be the minimum fabrication size. Since two cell transistors which share a drain region are formed in one element region AA, the longitudinal width of the element region AA is 5F. Cell capacitors whose longitudinal size is about 3F are densely laid out in an array such that they are adjacent at a layout interval of 4F in the direction of bit lines BL.

A plate adhesion layer 32 such as a $Ta_2O_5$ film is formed on the plate electrode 31. An interlayer dielectric film is formed on the plate adhesion layer 32. Metal interconnection layers 34 are formed on the interlayer dielectric film 33. Each metal interconnection layer has a multilayered structure including, e.g., a TiN film 34a and tungsten film 34b. An interlayer dielectric film 35 is further formed on the interlayer dielectric film 33. Thus, a DRAM is formed.

Figure 2A:
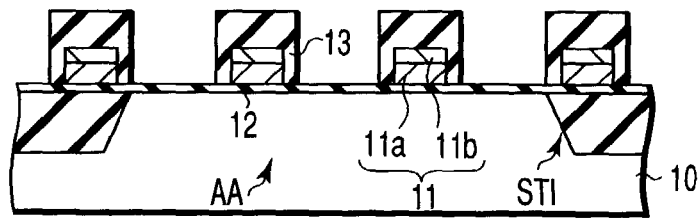
FIGS. 2A to 2G are sectional views sequentially showing the steps in manufacturing the DRAM according to the first embodiment of the present invention.

A method of manufacturing the DRAM with the above structure will be described next with reference to FIGS. 2A to 2U. FIGS. 2A to 2U, except FIGS. 2H, 2J, and 2P, are sectional views sequentially showing the step in manufacturing the DRAM. FIGS. 2H, 2J, and 2P are sectional perspective views corresponding to FIGS. 2G, 2I, and 2O, respectively.

First, as shown in FIG. 2A, the element isolation region STI is formed in a memory cell array region in the silicon substrate 10. A MOS transistor is formed by a known technique. More specifically, a silicon oxide film serving as the gate insulating film 12 is formed by, e.g., thermal oxidation. Next, the polysilicon film 11a and tungsten film 11b are deposited on the gate insulating film 12. The polysilicon film 11a and tungsten film 11b are patterned to form the plurality of gate electrodes 11 having a stripe shape. After that, an impurity is selectively doped into the silicon substrate 10 by ion implantation to form impurity diffusion layers (not shown) serving as source and drain regions. The MOS transistor thus formed functions as the cell transistor of a DRAM memory cell. Next, the silicon nitride film 13 is formed on the upper and side surfaces of each gate electrode 11 by, e.g., CVD (Chemical Vapor Deposition).

Figure 2B:
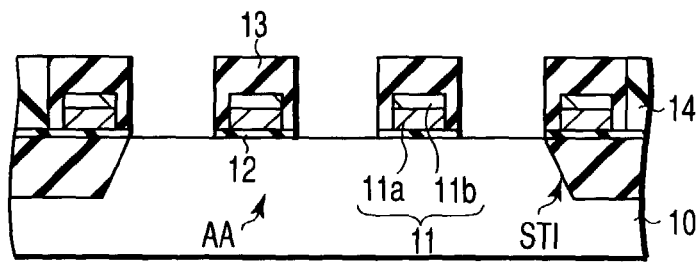

As shown in FIG. 2B, the silicon oxide film 14 serving as an interlayer dielectric film is formed on the silicon substrate 10 so as to cover the silicon nitride films 13. Then, the silicon oxide film 14 on each silicon nitride film 13 is removed by CMP (Chemical Mechanical Polishing) using the silicon nitride film 13 as a stopper. Subsequently, the silicon oxide films 14 in cell contact plug formation regions are removed in self-align manner with respect to the gate electrode 11 using lithography and etching.

Figure 2C:
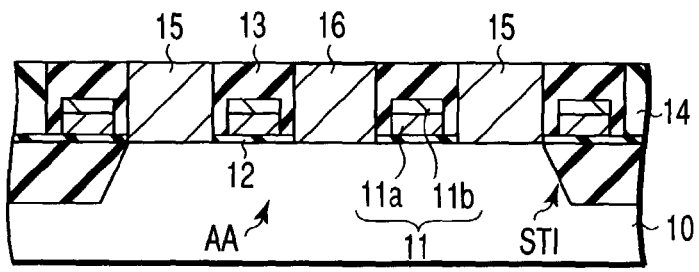

As shown in FIG. 2C, amorphous silicon doped with arsenic (As) is deposited on the silicon substrate 10, silicon nitride films 13, and interlayer dielectric films 14. The cell contact plugs 15 and 16 are formed by removing the amorphous silicon on the silicon nitride films 13 by, e.g., CMP.

Figure 2D:
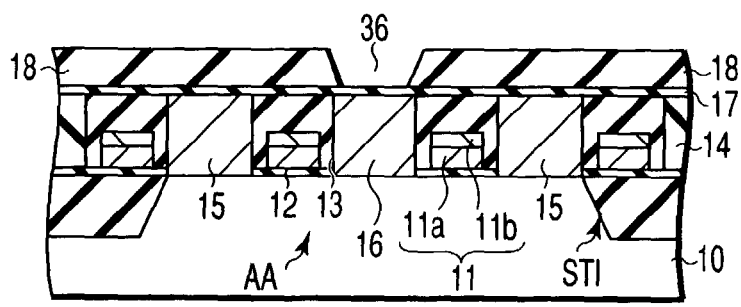

As shown in FIG. 2D, the silicon nitride thin film 17 serving as a metal diffusion barrier film is formed on the silicon nitride films 13 and cell contact plugs 15 and 16. For example, the silicon oxide film 18 serving as an interlayer dielectric film is formed on the silicon nitride thin film 17. The silicon oxide film 18 immediately above the cell contact plug 16 (bit line contact plug formation region) is removed to form an opening portion 36 by lithography and etching.

Figure 2E:
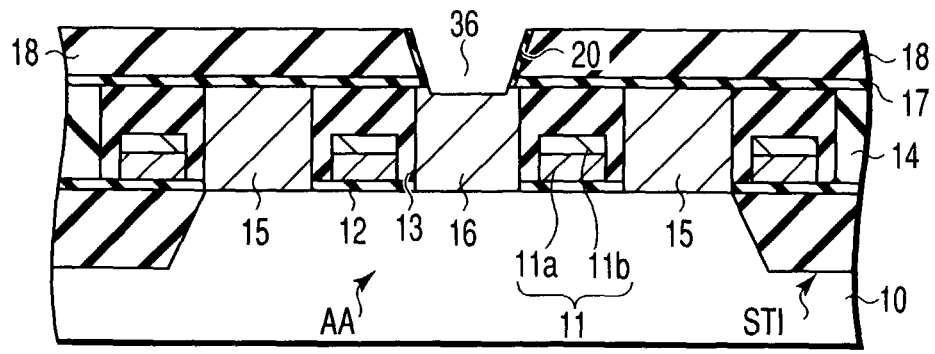

As shown in FIG. 2E, the silicon nitride thin film 20 serving as a sidewall insulating film is formed on the interlayer dielectric film 18 and in the opening portion 36. The silicon nitride film 20 on the silicon oxide film 18 and the silicon nitride films 20 and 17 on the bottom surface of the opening portion 36 are removed by etch back using RIE (Reactive Ion Etching). As a result, the cell contact plug 16 is exposed to the bottom portion of the opening portion 36.

Figure 2F:
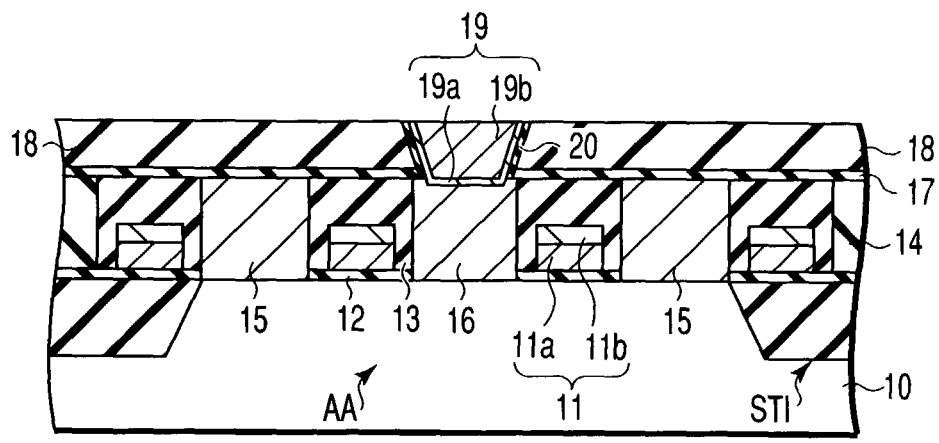

Next, as shown in FIG. 2F, the TiN/Ti multilayered film 19a serving as a barrier metal film is formed on the silicon oxide film 18 and in the opening portion 36. Subsequently, the tungsten film 19b is formed to fill the opening portion 36. The TiN/Ti multilayered film 19a and tungsten film 19b on the silicon oxide film 18 are removed by CMP or the like such that they remain only in the opening portion 36, thereby forming the bit line contact plug 19.

Figure 2G:
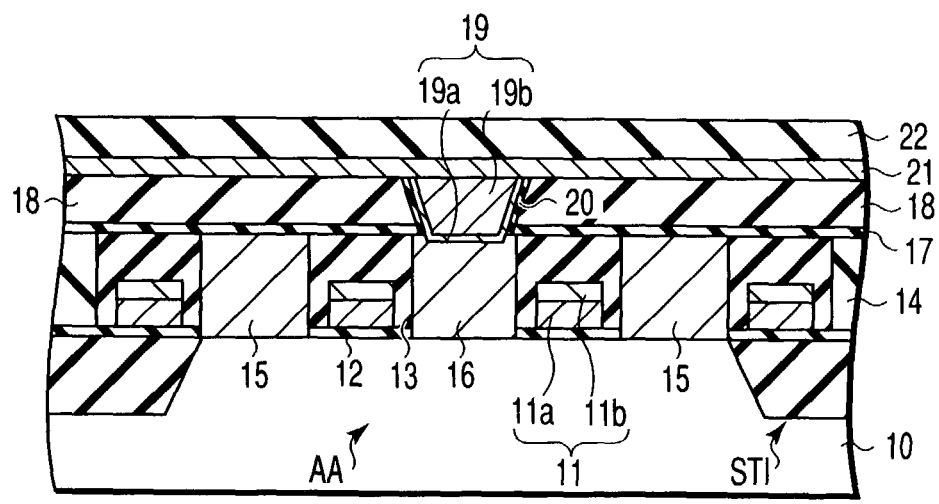

As shown in FIG. 2G, the tungsten film 21 and silicon nitride film 22 serving as the bit lines BL are formed on the silicon oxide film 18 and bit line contact plug 19. The tungsten film 21 and silicon nitride film 22 are patterned into a stripe shape running in a direction perpendicular to the word lines WL (gate electrodes 11) using lithography and RIE, thereby completing the bit lines BL. A silicon oxide film is deposited on the bit lines BL and on the silicon oxide films 18 between the bit lines BL by HDP (High Density Plasma)-CVD or the like. The silicon oxide film on the silicon nitride film 22 is removed by CMP using the silicon nitride film 22 on the tungsten film 21 as a stopper. Consequently, the structure shown in FIG. 2G is completed. FIG. 2H is a sectional perspective view of a region A1 in FIG. 1A, which corresponds to the step shown in FIG. 2G. As shown in FIG. 2H, the metal interconnection layers 21 (bit lines BL) and silicon nitride films 22 having a stripe pattern perpendicular to the word lines WL are present is immediately above the cell contact plugs 16 connected to the drain regions of cell transistors. On the other hand, silicon oxide films 37 having a stripe pattern perpendicular to the word lines WL are present immediately above the contact plugs 15 connected to the source regions of cell transistors. The silicon oxide films 37 fill the regions between the adjacent bit lines BL.

Figure 2K:
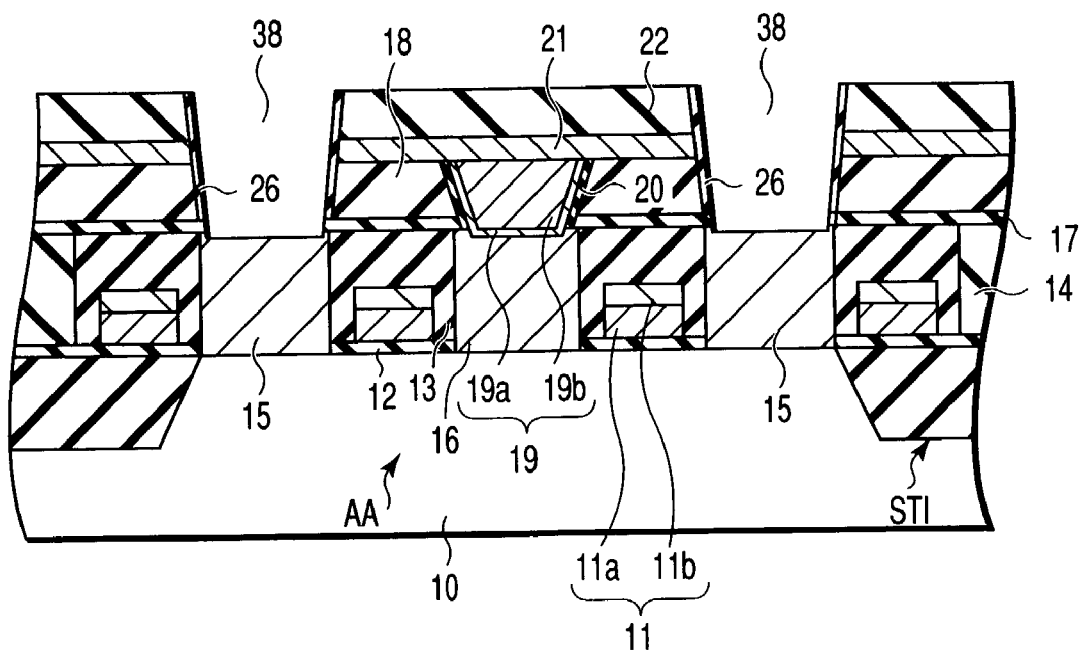

Next, as shown in FIG. 2I, the silicon oxide films 18 and 37 immediately above the cell contact plugs 15 (node contact plug formation regions) are removed by lithography and etching to form opening portions 38. In this step, selective etching is used such that the silicon nitride film is etched at a low etching rate, and the silicon oxide film is etched at a high etching rate, thereby forming the opening portions 38 self-aligning to the bit lines BL. FIG. 2J is a sectional perspective view of the region A1 in FIG. 1A, which corresponds to the step shown in FIG. 2I. As shown in FIG. 2J, the plurality of opening portions 38 are present in the silicon oxide films 18 and 37 between the bit lines BL. The silicon nitride film 17 is exposed to the bottom surfaces of the opening portions 38. In addition, the metal interconnection layers 21 serving as the bit lines BL are exposed to the side surfaces of the opening portions 38 on the bit line BL sides. Hence, when node contact plugs are directly formed in the opening portions 38, the node contact plugs and bit lines BL short-circuit. To prevent this, the silicon nitride thin films 26 serving as sidewall insulating films are formed on the silicon oxide films 37 and silicon nitride films 22 and in the opening portions 38, as shown in FIG. 2K. The silicon nitride film 26 on the silicon oxide films 37, silicon nitride films 22, and silicon nitride films 26 and 17 on the bottom surfaces of the opening portions 38 are removed by etch back using RIE. As a result, the cell contact plugs 15 are exposed to the bottom portions of the opening portions 38. The silicon nitride films 26 remain only on the side surfaces of the opening portions 38.

Figure 2L:
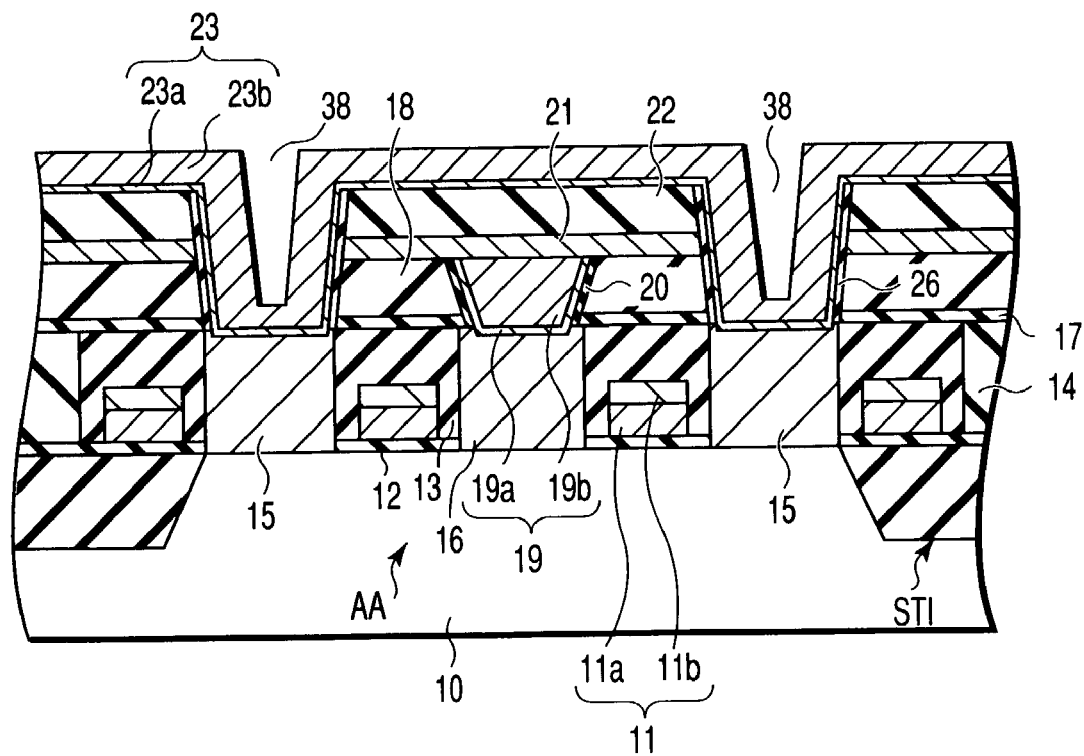

As shown in FIG. 2L, a Ti film is formed on the silicon oxide films 37 and silicon nitride films 22 and in the opening portions 38 by, e.g., sputtering. Annealing is performed, and simultaneously, the surface is nitrided to form the TiN/Ti multilayered film 23a. Subsequently, the TiN film 23b is formed on the TiN/Ti multilayered film 23a by CVD or the like. At this time, for example, a gap about ¼ the opening size of the opening portion 38 is preferably left without completely filling the opening portion 38 with the TiN film 23b.

Figure 2M:
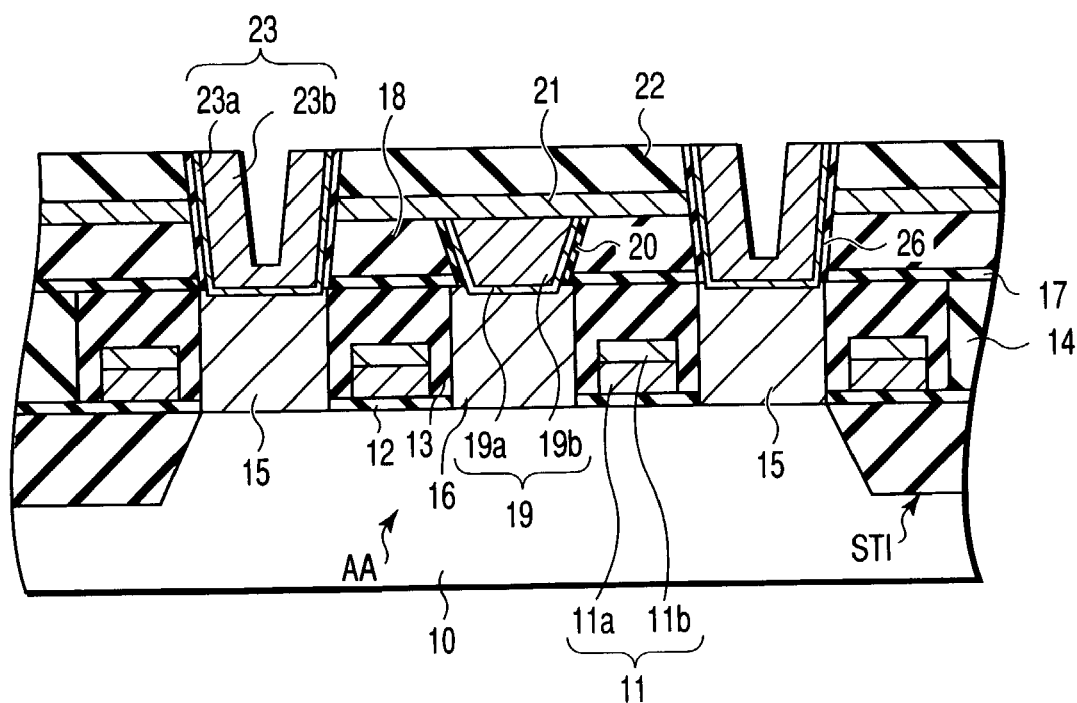

After that, a sacrificial film such as a resist is coated on the TiN film 23 and in the opening portions 38. The sacrificial film, TiN/Ti multilayered film 23a, and TiN film 23b on the silicon oxide films 37 and silicon nitride films 22 are removed. After that, by removing the sacrificial films in the opening portions 38 by, e.g., wet etching, the node contact plugs 23 each having a gap inside are completed, as shown in FIG. 2M.

Figure 2N:
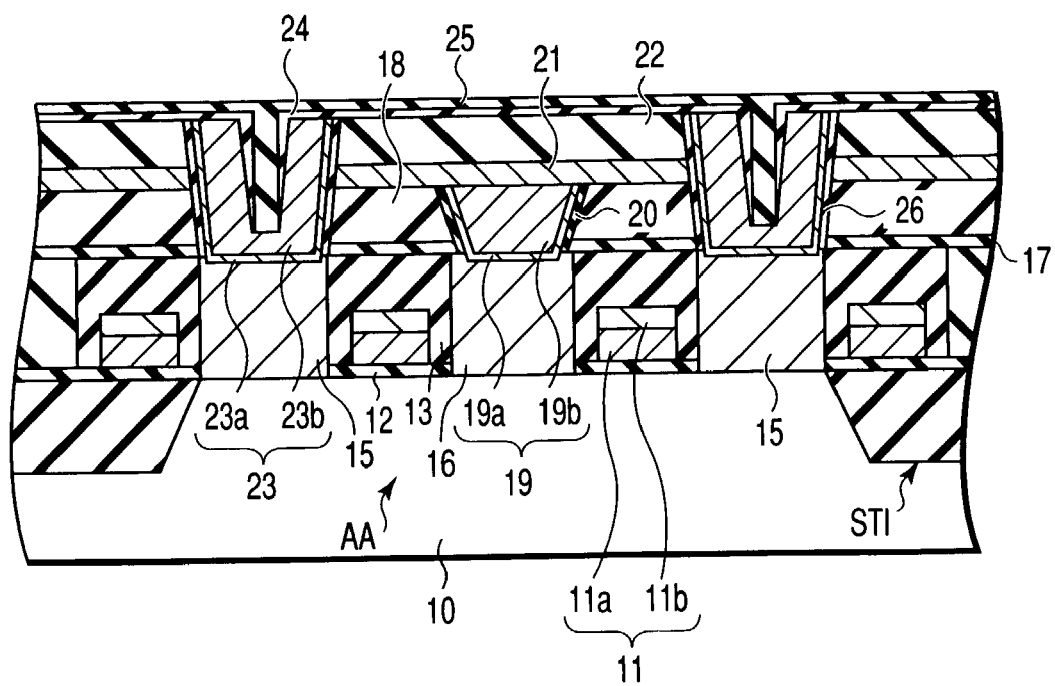

As shown in FIG. 2N, for example, the silicon nitride film 24 serving as a RIE stopper film is formed on the silicon oxide films 37 and silicon nitride films 22 and in the opening portions 38 by plasma CVD or the like. The gaps in the node contact plugs 23 need not always be filled with the silicon nitride film 24. Subsequently, for example, the $Ta_2O_5$ film 25 serving as a wet stopper film is formed on the silicon nitride film 24.

Next, as shown in FIG. 2O, an interlayer sacrificial film 39 is deposited on the $Ta_2O_5$ film 25. The interlayer sacrificial film is, e.g., a silicon oxide film doped with boron or phosphorus. The interlayer sacrificial film 39 and $Ta_2O_5$ film 25 in cell capacitor formation regions are removed using lithography and selective RIE. The silicon oxide film and tantalum oxide film can be etched under the same RIE conditions. Hence, etching temporarily stops at the silicon nitride film 24 serving as an RIE stopper film. FIG. 2P is a sectional perspective view of the region A1 in FIG. 1A, which corresponds to the step shown in FIG. 2O. As shown in FIG. 2P, a plurality of opening portions 40 are formed in the interlayer sacrificial film 39. The silicon nitride film 24 is exposed to the bottom portion of each opening portion 40.

Figure 2Q:
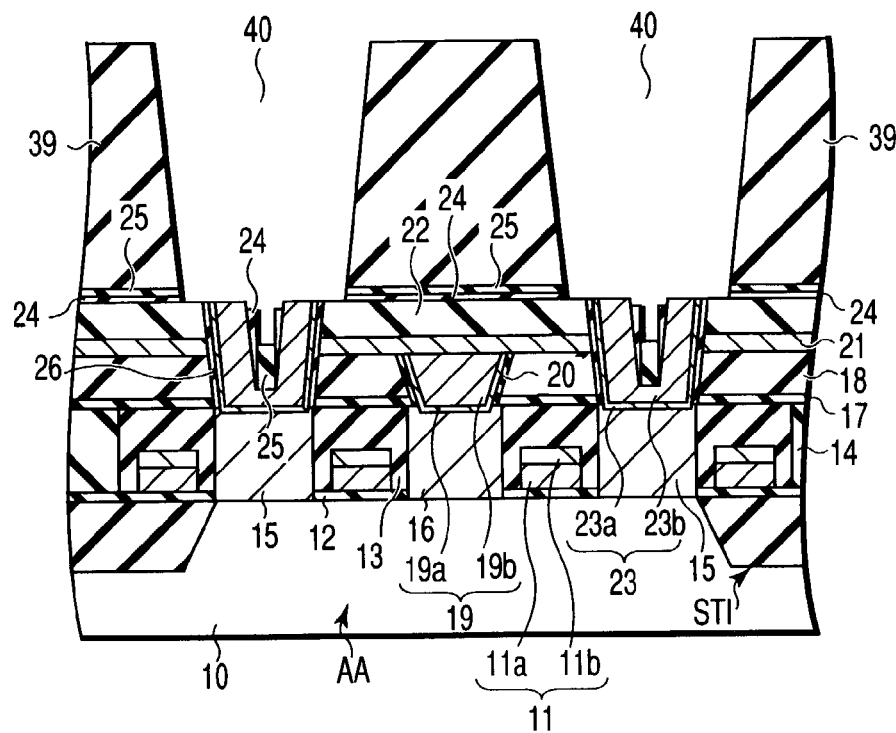

As shown in FIG. 2Q, the silicon nitride film 24 exposed to the bottom portion of each opening portion 40 is removed by RIE or the like. As a result, the node contact plugs 23 are exposed to the bottom portions of the opening portions 40.

Figure 2R:
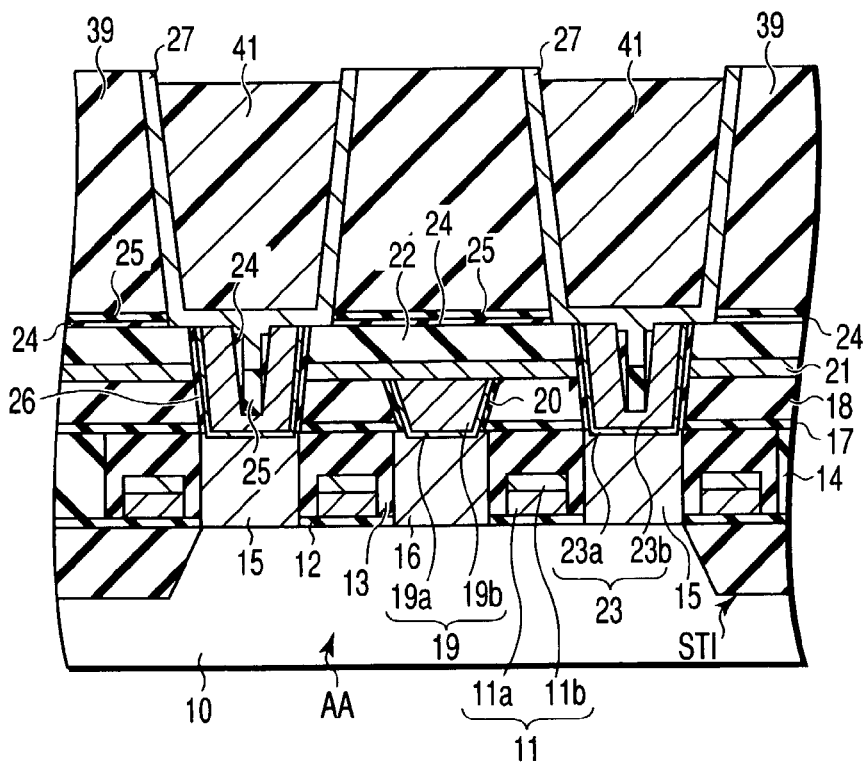
Figure 2U:
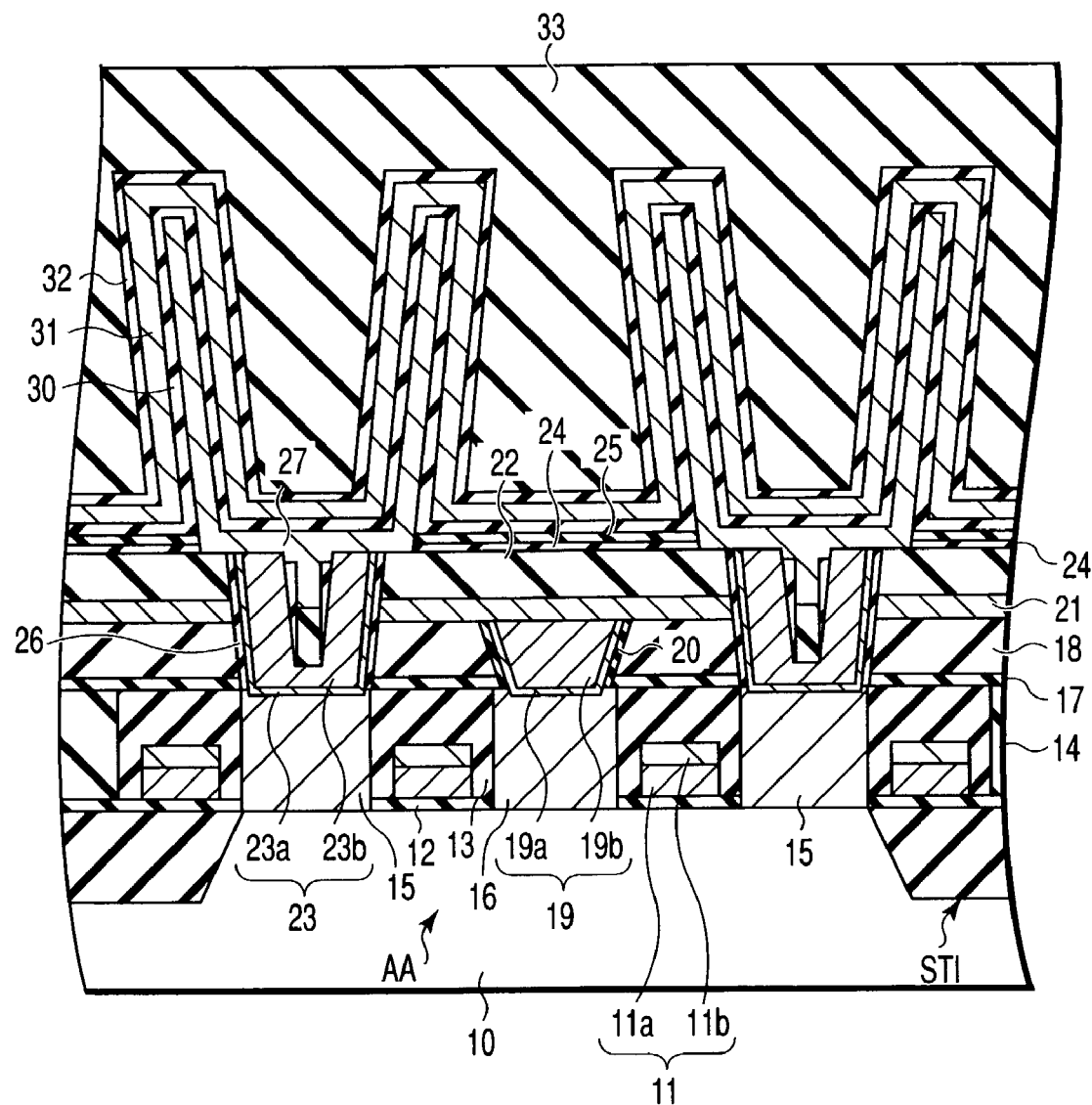

As shown in FIG. 2R, the ruthenium film 27 serving as a storage node electrode is formed on the interlayer sacrificial film 39 and in the opening portions 40. In addition, a sacrificial film 41 such as a resist is formed on the storage node electrode 27 and interlayer sacrificial film 39. After that, the ruthenium film 27 and sacrificial film 41 on the interlayer sacrificial film 39 are removed by CMP or the like such that they remain only in the opening portions 40.

As shown in FIG. 2S, the interlayer sacrificial film 39 is removed by wet etching using, e.g., a buffer solution prepared by mixing diluted HF and $NH_4F$. Unlike RIE, the silicon oxide film and tantalum oxide film have a high etching selectivity for wet etching. Hence, the wet etching in this step stops at the $Ta_2O_5$ film 25 serving as a wet stopper film. As a consequence, the double-surface-cylinder storage node electrodes 27 are completed.

As shown in FIG. 2T, the sacrificial film 41 remaining in the cylinder of each storage node electrode 27 is removed by resist ashing and wet process. The high-dielectric-constant film 30 such as a $Ta_2O_5$ film serving as a capacitor insulating film and the metal film 31 such as a ruthenium film serving as a plate electrode are formed on the storage node electrodes 27. Subsequently, for example, the $Ta_2O_5$ film 32 serving as a plate adhesion layer is formed on the plate electrode 31. As a result, double-surface-cylinder cell capacitors as shown in FIG. 2T are completed.

The plate electrode 31 is patterned by lithography and etching. The unwanted plate adhesion layer 32, capacitor insulating film 30, wet stopper film 25, and RIE stopper film 24 are also simultaneously removed together with the plate electrode 31. As shown in FIG. 2U, the interlayer dielectric film 33 that covers the cell capacitors is formed from, e.g., a silicon oxide film and planarized by CMP or the like. After that, multilayered interconnections and interlayer dielectric film are formed to complete the DRAM shown in FIGS. 1A and 1B.

According to the semiconductor device having the above arrangement formed by the above manufacturing method, the following effects are obtained.

(1) The conventional liner material can be omitted. In the DRAM according to this embodiment, a metal compound ($Ta_2O_5$ in this embodiment) is used as the wet stopper film 25 that is conventionally often a silicon nitride film or the like. For this reason, sufficient adhesion can be ensured between the wet stopper film 25 and the storage node electrode 27 formed using a metal material (ruthenium in this embodiment) such as a platinum group element. More specifically, a chemical solution can be prevented from soaking into the interface between the storage node electrode 27 and the wet stopper film 25 and corrode the underlayer in wet-etching the interlayer sacrificial film 39 described with reference to FIG. 2S. Hence, the conventional liner material can be omitted, the manufacturing process can be simplified, and the manufacturing yield can be increased.

Figure 3A:
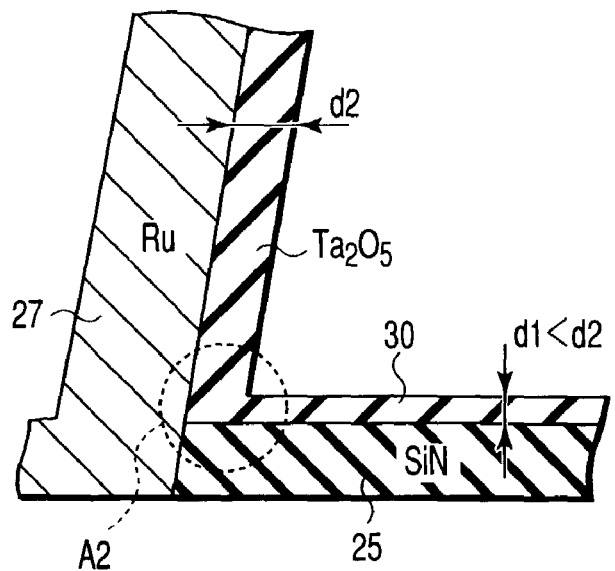
FIGS. 3A and 3B are enlarged partial sectional views respectively showing a conventional DRAM structure and the structure of the DRAM according to the first embodiment.
Figure 3B:
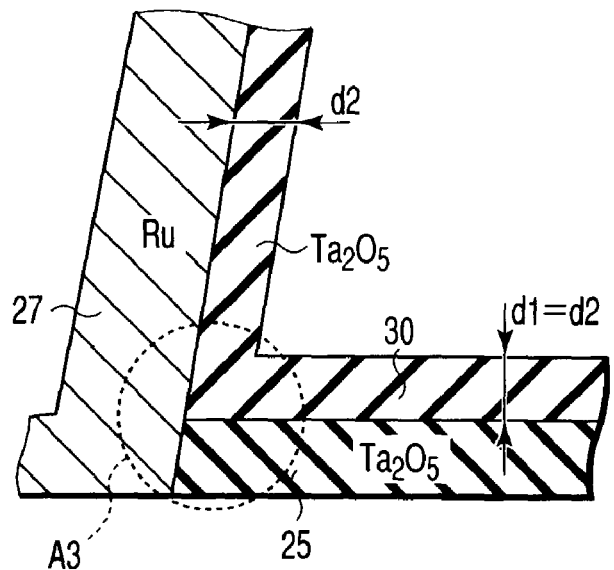

(2) The reliability of the cell capacitor can be increased. This will be described with reference to FIGS. 3A and 3B. FIGS. 3A and 3B are sectional views of a region where particularly the wet stopper film and storage node electrode in the DRAM come into contact in forming a capacitor insulating film. FIG. 3A shows the conventional structure, and FIG. 3B shows the structure according to this embodiment. In forming the capacitor insulating film 30, the storage node electrode 27 and wet stopper film 25 are exposed to the surface. When a high-dielectric-constant film such as a $Ta_2O_5$ film serving as the capacitor insulating film is to be deposited by CVD, an initial layer serving as the "nucleus" of growth must be formed at the early stage of growth (this is called an "incubation time"). The incubation time depends on the underlying material. For example, the incubation time is zero on a ruthenium film but requires several ten sec on a silicon oxide film or silicon nitride film. In the conventional structure, a silicon nitride film is generally used as the wet stopper film 25. Hence, the high-dielectric-constant film 30 such as a $Ta_2O_5$ film serving as a capacitor insulating film is formed on the metal film 27 such as a ruthenium film serving as a storage node electrode and on the silicon nitride film 25 serving as a wet stopper film. At this time, the incubation time is generated only on the wet stopper film 25. As a result, a film thickness d1 of the $Ta_2O_5$ film 30 on the wet stopper film 25 is smaller than a film thickness d2 on the storage node electrode 27 in correspondence with the incubation time, as shown in FIG. 3A. Then, the $Ta_2O_5$ film 30 formed thin at a corner portion (region A2 in FIG. 3A) where the storage node electrode 27 and wet stopper film 25 come into contact is readily affected by stress, resulting in a decrease in reliability of the cell capacitor. However, in the structure according to this embodiment, the wet stopper film 25 is formed from the same material as that of the capacitor insulating film 30 (high-dielectric-constant film such as a $Ta_2O_5$ film). Hence, no incubation time is generated either on the wet stopper film 25 or on the storage node electrode 27. As a result, the film thickness d1 of the $Ta_2O_5$ film 30 on the wet stopper film 25 is the same as the film thickness d2 on the storage node electrode 27, as shown in FIG. 3B. At a corner portion (region A3 in FIG. 3B) where the storage node electrode 27 and wet stopper film 25 come into contact, the capacitor insulating film 30 can be regarded to be thicker in correspondence with the wet stopper film 25. Hence, the capacitor insulating film particularly at the corner portion is thick, and the strength against stress in this region can be increased. This increases the reliability of the cell capacitor.

(3) Corrosion of the underlying film when the function of the wet stopper film is insufficient can be minimized. In this embodiment, the interlayer sacrificial film 39 used in forming the storage node electrode is a silicon oxide film doped with boron and/or phosphorus. On the other hand, the interlayer dielectric film 37 between the adjacent bit lines BL is a silicon oxide film formed by HDP-CVD without doping the impurity. The etching rate for the silicon oxide film by a diluted HF-$NH_4F$ buffer solution can be increased to about 100 times by doping boron or phosphorus. Hence, the wet etching time of the interlayer sacrificial film 39 described with reference to FIG. 2S can be largely shortened. In this case, even when the wet stopper film 25 has a defect such as a pinhole, and the etchant corrodes the underlying layer beyond the wet stopper film 25, the corrosion amount of the underlying silicon oxide film 37 can be minimized because the silicon oxide film is undoped. As a result, the manufacturing yield of DRAMs can be increased.

(4) Stress generated in the node contact plug portion can be relaxed. TiN that forms the node contact plug generates a large stress due to the peripheral influence because of the characteristics of TiN. For this reason, when the node contact plug is formed by completely filling the contact hole with the TiN film, cracks may be generated in the interlayer dielectric film in the subsequent annealing step or the like. In this embodiment, however, the node contact plug 23 has a gap inside. That is, as described with reference to FIG. 2L, the TiN film 23b does not completely fill the opening portion 38. Hence, the TiN film 23b itself can have a small thickness and suppress stress. In addition, stress on the TiN film 23b can be relaxed by the gap in the plug. Hence, the influence on the other regions including the interlayer dielectric film can be minimized. Consequently, the manufacturing yield of DRAMs can be increased.

(5) Any damage to the underlying layer by RIE in forming an opening portion for a storage node electrode can be prevented. In the DRAM according to this embodiment, the RIE stopper film 24 is formed from a silicon nitride film. As the size of a semiconductor device becomes smaller, the storage node electrode of a stacked cell capacitor tends to be higher (deeper). For example, in a DRAM according to the design rule of 0.13-$\mu$m, the height of a storage node electrode can be about 1 $\mu$m. That is, in the step described with reference to FIG. 2O, the opening portions 40 having a depth of about 1 $\mu$m are formed in the interlayer sacrificial film 39. If no etching stopper is used, the opening portion 40 that reaches the node contact plug 23 must be formed by time control. However, since the opening portion 40 is deep, the bottom portion of the opening is inevitably damaged by time control RIE. More specifically, the upper surface of the node contact plug 23 may be undesirably exposed to RIE, or the silicon oxide film 37 is unnecessarily etched. In this embodiment, however, the thin RIE stopper film 24 is formed. RIE is executed while using the RIE stopper film 24 as an etching stopper, thereby forming the opening portions 40 in the interlayer sacrificial film 39. After that, the RIE stopper film 24 is removed by time control RIE until the node contact plug 23 is exposed. When the opening portions 40 are formed by two-step RIE, and the thin RIE stopper film is etched by the final RIE process, the degree of damage to the bottom portion of each opening portion 40 can be minimized. As a result, the manufacturing yield of DRAMs can be increased. Note that the RIE stopper film 24 may be formed on the wet stopper film 25.

(6) Any harmful influence by metal atoms can be prevented. Along with the recent size reduction and diversification of semiconductor devices, there are many opportunities of use of new metal elements including ruthenium, which are not popular before, for DRAMS. However, such metal elements, e.g., ruthenium have a relatively high diffusion speed in a silicon oxide film. Hence, ruthenium atoms in the storage node electrode 27 may diffuse in the interlayer dielectric film and reach the semiconductor substrate. These metal atoms may cause bad influence, e.g., leakage in cell transistors. In the DRAM according to this embodiment, however, the metal diffusion barrier film 17 and sidewall insulating films 20 and 26, which are formed from silicon nitride films, are arranged. In the silicon nitride film, the diffusion speed of ruthenium is relatively low, as is known. Hence, these silicon nitride films can prevent ruthenium from reaching the semiconductor substrate surface. As a result, the manufacturing yield of DRAMs can be increased, and stable DRAM operation can be realized.

(7) The adhesion between the plate electrode 31 and the interlayer dielectric film can be increased. As described above, to exploit the characteristics of a high-dielectric-constant material or ferroelectric material serving as a capacitor insulating film at maximum, a metal element of a platinum group or the like, including ruthenium, must be used as the plate electrode material. However, these materials have a low adhesion to, e.g., a silicon oxide film serving as an interlayer dielectric film. Hence, the plate electrode may peel off from the interlayer dielectric film in annealing or the like, resulting in a fatal defect for a semiconductor device. However, according to this embodiment, the plate adhesion layer 32 made of a metal oxide, e.g., a $Ta_2O_5$ film, is formed between the plate electrode 31 and the interlayer dielectric film 33. Hence, the adhesion between the plate electrode 31 and the interlayer dielectric film 33 increases, and the manufacturing yield of DRAMs can be increased.

(8) The reliability of the capacitor insulating film can be increased. In manufacturing a semiconductor device, annealing in a hydrogen atmosphere is often executed after formation of final multilayered interconnections in order to improve the characteristics of transistors. In this case, hydrogen atoms may enter the capacitor insulating film and degrade it. According to this embodiment, however, the plate adhesion layer 32 as a metal oxide film is formed, as described above in effect (7). This can prevent hydrogen atoms from degrading the capacitor insulating film.

Note that the plate adhesion layer 32 need not always be formed from the same material as that of the capacitor insulating film, as in this embodiment. However, if the capacitor insulating film, wet stopper film, and plate adhesion layer are made of the same material as much as possible, the number of film forming apparatuses in the semiconductor manufacturing line can be reduced. As a result, the manufacturing cost of semiconductor devices can be reduced.

Figure 4:
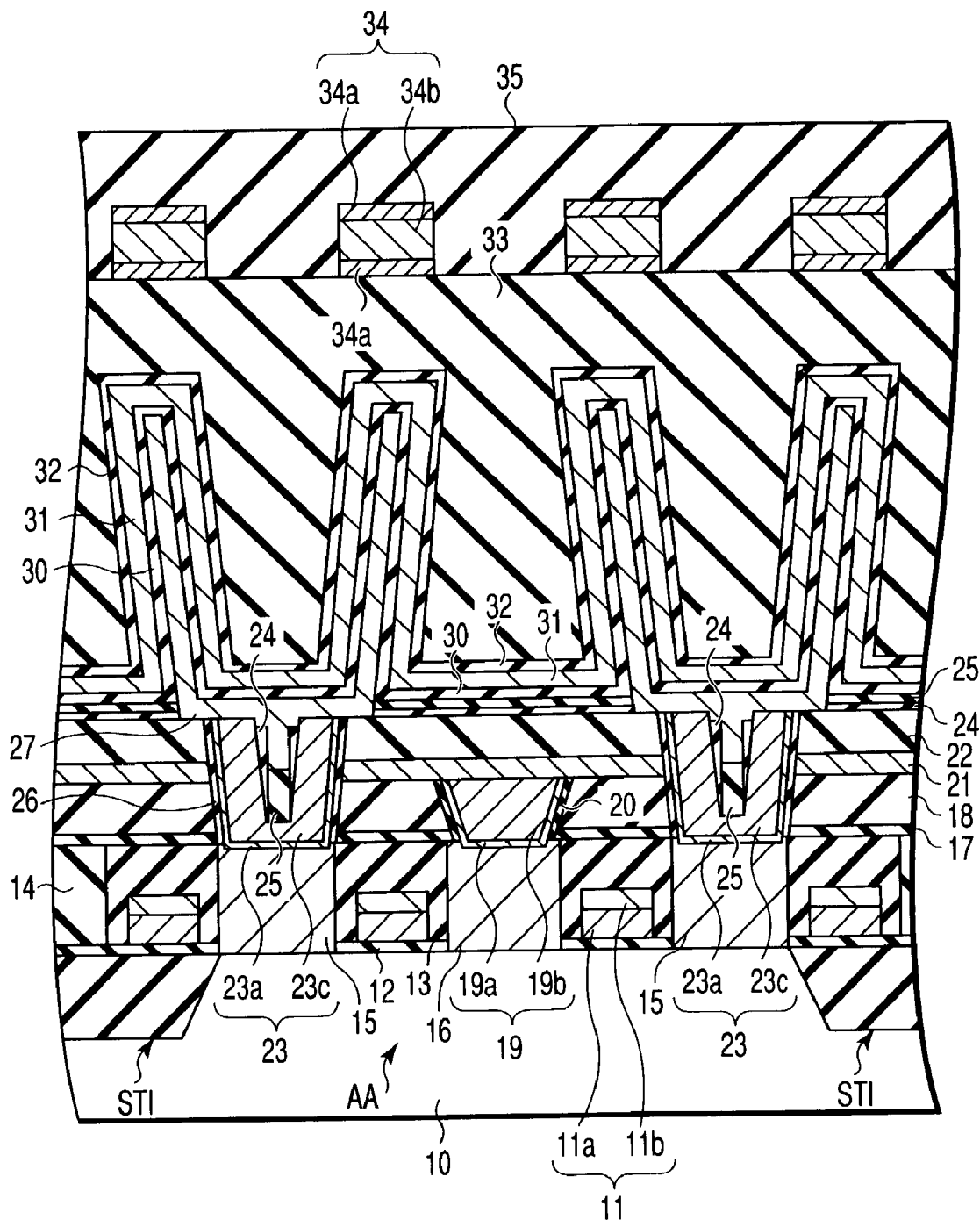
FIG. 4 is a sectional view of a DRAM according to the second embodiment of the present invention.

A semiconductor device according to the second embodiment of the present invention will be described next with reference to FIG. 4 while exemplifying a DRAM. FIG. 4 is a sectional view of a DRAM according to this embodiment.

As shown in FIG. 4, in the DRAM according to this embodiment, a node contact plug 23 of the first embodiment is formed from a TiN/Ti film 23a and ruthenium film 23c. The remaining parts of the structure are the same as in the first embodiment, and a detailed description thereof will be omitted. The DRAM according to this embodiment can be formed by depositing the ruthenium film 23c in place of a TiN film 23b in the step shown in FIG. 2L.

According to this embodiment, the following effects can be obtained in addition to effects (1) to (8) described in the first embodiment.

(9) The adhesion between the node contact plug and the storage node electrode can be increased. In this embodiment, the node contact plug is formed using ruthenium, i.e., the same material as that of the storage node electrode. That is, no material difference is present between the node contact plug and the storage node electrode. For this reason, for example, formation of, e.g., an oxide film at the interface between the storage node electrode and the node contact plug can be prevented. Hence, the adhesion and electrical conductivity between the storage node electrode and the node contact plug can greatly be increased. As a result, the manufacturing yield of DRAMs can be increased, and the performance can be improved.

(10) Stress generated in the node contact plug portion can be relaxed. This effect is the same as effect (4) described in the first embodiment. When the node contact plug is formed from ruthenium, the following advantages can particularly be obtained. When a conductive film including a platinum group element such as ruthenium is deposited by CVD, the growth temperature is relatively low and about 300° C. After formation of the node contact plug, annealing at a higher temperature is normally executed in the step of forming a high-dielectric-constant film such as a $Ta_2O_5$ film or in the step of forming multilayered interconnections. The volume of a ruthenium film immediately after formation readily shrinks due to heat. Hence, when the node contact plug is formed from a ruthenium film that completely fills the plug portion, stress more than that in use of a TiN film is generated. This poses serious problems. For example, cracks are formed in the interlayer dielectric film, or peeling occurs at the interface between the metal film and the insulating film on contact side surface. However, when the node contact plug has a gap, as in this embodiment, the ruthenium film itself can be made thin. This suppresses generation of stress and also relaxes generated stress. Consequently, the influence on the other regions such as the interlayer dielectric film can be minimized. Hence, the manufacturing yield of DRAMs can be increased.

As described above, according to this embodiment, the manufacturing process of the semiconductor device can be simplified, and the reliability of the semiconductor device can be increased. In the first and second embodiments, ruthenium (Ru) is used as the capacitor electrode material, and a tantalum oxide film ($Ta_2O_5$ film) formed from a high-dielectric-constant material is used as the material of the capacitor insulating film. A "high-dielectric-constant material" means a material with a higher dielectric constant than that of silicon nitride. For the capacitor electrode material, any other platinum group such as platinum (Pt), iridium (Ir), palladium (Pd), osmium (Os), or rhodium (Rh), any other conductive film represented by rhenium (Re), or an alloy thereof or a conductive metal oxide thereof, such as Sr—Ru—O (SRO), $RuO_2$, or $IrO_2$ can be used. For the capacitor insulating film, a high-dielectric-constant film or ferroelectric film of an oxide containing any one of barium (Ba), strontium (Sr), lead (Pb), titanium (Ti), zirconium (Zr), and tantalum (Ta), aluminum (Al) for example, Ta—Ti—O, barium titanate-strontium (Ba—Sr—Ti—O: BST), strontium titanate (Sr—Ti—O: STO), lead zirconate titanate (Pb—Zr—Ti—O: PZT), or strontium tantalate-bismuth (Sr—Bi—Ta—O: SBT), alumina ($Al_2O_3$) can be used.

In the above embodiments, a cylinder type capacitor structure has been exemplified. However, the embodiment of the present invention is not limited to this and can also be applied to a pillar type or concave type stacked capacitor. The embodiment of the present invention can be applied not only to a DRAM but also to, e.g., an EEPROM (Electrically Erasable and Programmable Read Only Memory), Ferroelectric RAM, MRAM (Magneto-resistive RAM), and DRAM embedded logic. The embodiment of the present invention can be applied not only to a semiconductor memory but also widely to general semiconductor devices using the above high-dielectric-constant material/ferroelectric material and platinum group material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a MOS transistor formed on a semiconductor substrate;
   a first interlayer dielectric film formed on the semiconductor substrate so as to cover the MOS transistor;
   a first high-dielectric-constant film formed on the first interlayer dielectric film and having an opening portion that reaches the first interlayer dielectric film;
   a first conductive film containing a metal element and formed to be partially embedded in the opening portion, the first conductive film being in contact with the first high-dielectric constant film, an upper surface of the first high-dielectric-constant film being lower than a top of the first conductive film;
   an insulating film which is formed between the first interlayer dielectric film and the first high-dielectric-constant film, and is formed from a material different to the first interlayer dielectric film, the first conductive film being in contact with the insulating film;
   a second high-dielectric-constant film formed on the first conductive film; and
   a second conductive film formed on the second high-dielectric-constant film.

2. The device according to claim 1, wherein the first and second high-dielectric-constant films are substantially formed from the same material.

3. The device according to claim 1, wherein the first and second high-dielectric-constant films are substantially formed from a metal compound.

4. The device according to claim 1, wherein each of the first and second high-dielectric-constant films is substantially formed from a tantalum oxide film.

5. The device according to claim 1, wherein the metal element contained in the first conductive film belongs to a platinum group.

6. The device according to claim 1, wherein the first conductive film is substantially formed from a ruthenium film.

7. The device according to claim 1, further comprising a contact plug which is formed in the first interlayer dielectric film so as to be in contact with the first conductive film located in the opening portion of the first high-dielectric-constant film.

8. The device according to claim 7, wherein the first conductive film and the contact plug are substantially formed from the same material.

9. The device according to claim 7, wherein each of the first conductive film and the contact plug is substantially formed from a ruthenium film.

10. The device according to claim 1, further comprising a third high-dielectric-constant film formed on the second conductive film.

11. The device according to claim 10, wherein the first and third high-dielectric-constant films are substantially formed from the same material.

12. The device according to claim 10, wherein the first and third high-dielectric-constant films are substantially formed from a metal compound.

13. The device according to claim 10, wherein each of the first and third high-dielectric-constant films is substantially formed from a tantalum oxide film.

14. The device according to claim 1, wherein a diffusion speed of metal atoms contained in the first conductive film is lower in the first high-dielectric-constant film than in the first interlayer dielectric film.

15. The device according to claim 1, further comprising a metal diffusion preventing film which is formed in the first interlayer dielectric film so as to cover the MOS transistor and prevent metal atoms contained in the first conductive film from diffusing into the MOS transistor.

16. The device according to claim 15, wherein the metal diffusion preventing film is substantially formed from a silicon nitride film.

17. The device according to claim 15, wherein a diffusion speed of metal atoms contained in the first conductive film is lower in the metal diffusion preventing film than in the first interlayer dielectric film.

18. The device according to claim 1, wherein the first conductive film serves as a storage node electrode of a double-surface-cylinder capacitor.

19. The device according to claim 1, further comprising a second interlayer dielectric film which is formed on and covers the second conductive film; and
   a metal wiring layer which is formed on the second interlayer dielectric film and has a multilayered structure.

20. A semiconductor device comprising:
   a plurality of cell transistors formed on a semiconductor substrate;
   a first interlayer dielectric film formed on the semiconductor substrate so as to cover the cell transistors;
   a plurality of contact plugs formed in the first interlayer dielectric film and electrically connected to the cell transistors, respectively;
   a high-dielectric-constant film formed on the first interlayer dielectric film and having opening portions that reach the first interlayer dielectric film and expose upper surfaces of the contact plugs;
   a plurality of cell capacitors having storage node electrodes formed to be partially embedded in the opening portions and electrically connected to the contact plugs, respectively, a capacitor insulating film formed on the storage node electrodes, and a plate electrode formed on the capacitor insulating film, the capacitor insulating film being substantially formed from a high-dielectric-constant material, the storage node electrodes including a metal element, as well as being in contact with the high-dielectric-constant film, an upper surface of the high-dielectric-constant film being lower than a top of the cell capacitors; and
   an insulating film which is formed between the first interlayer dielectric film and the high-dielectric-constant film, and is formed from a material different to the first interlayer dielectric film, the storage node electrode being in contact with the insulating film.

21. The device according to claim 20, wherein the storage node electrode and plate electrode contain a metal element belonging to a platinum group.

22. The device according to claim 20, further comprising at least one of a conductive layer and an insulating layer formed from a material different from that of the contact plug,
   wherein the contact plug has a cavity inside and at least one of a conductive layer and an insulating layer fills the cavity.

23. The device according to claim 20, wherein the cell capacitors have a double-surface-cylinder structure.

24. The device according to claim 20, further comprising a second interlayer dielectric film which is formed on and covers the cell capacitors; and
   a metal wiring layer which is formed on the second interlayer dielectric film and has a multilayered structure.

* * * * *